United States Patent [19]

Hamakawa et al.

[11] 4,385,200

[45] May 24, 1983

[54] PHOTOVOLTAIC CELL HAVING A HETERO JUNCTION OF AMORPHOUS SILICON CARBIDE AND AMORPHOUS SILICON

[76] Inventors: Yoshihiro Hamakawa, 3-17-4, Minami-Hanayashiki, Kawanishi, Hyogo; Yoshihisa Tawada, 14-39, Oike-Miyamadai, Kita-Ku, Kobe, Hyogo, both of Japan

[21] Appl. No.: 420,711

[22] Filed: Sep. 21, 1982

Related U.S. Application Data

[62] Division of Ser. No. 253,141, Apr. 10, 1981.

[30] Foreign Application Priority Data

Dec. 3, 1980 [JP] Japan .............................. 55-171375
Dec. 19, 1980 [JP] Japan .............................. 55-181150
Jan. 29, 1981 [JP] Japan .............................. 56-012313

[51] Int. Cl.$^3$ ........................................... H01L 31/06
[52] U.S. Cl. ...................................... 136/258; 357/2; 357/30

[58] Field of Search .............. 136/258 AM; 357/2, 30

[56] References Cited

U.S. PATENT DOCUMENTS 4,109,271 8/1978 Pankove .............................. 357/30
4,289,822 9/1981 Shimada et al. .................... 428/212
4,329,699 5/1982 Ishihara et al. .......................... 357/2

*Primary Examiner*—Aaron Weisstuch
*Attorney, Agent, or Firm*—Wenderoth, Lind & Ponack

[57] ABSTRACT

A photovoltaic cell having a hetero junction of amorphous silicon and amorphous silicon carbide has at least one of its p and n layers composed of amorphous silicon carbide of the general formula a-$Si_{1-x}C_x$ obtained by glow discharge decomposition of a mixture of at least one gas selected from among silane, silicon fluoride and the derivatives thereof, and at least one gas selected from among hydrocarbons, alkylsilanes, the fluorides thereof and the derivatives thereof.

6 Claims, 7 Drawing Figures

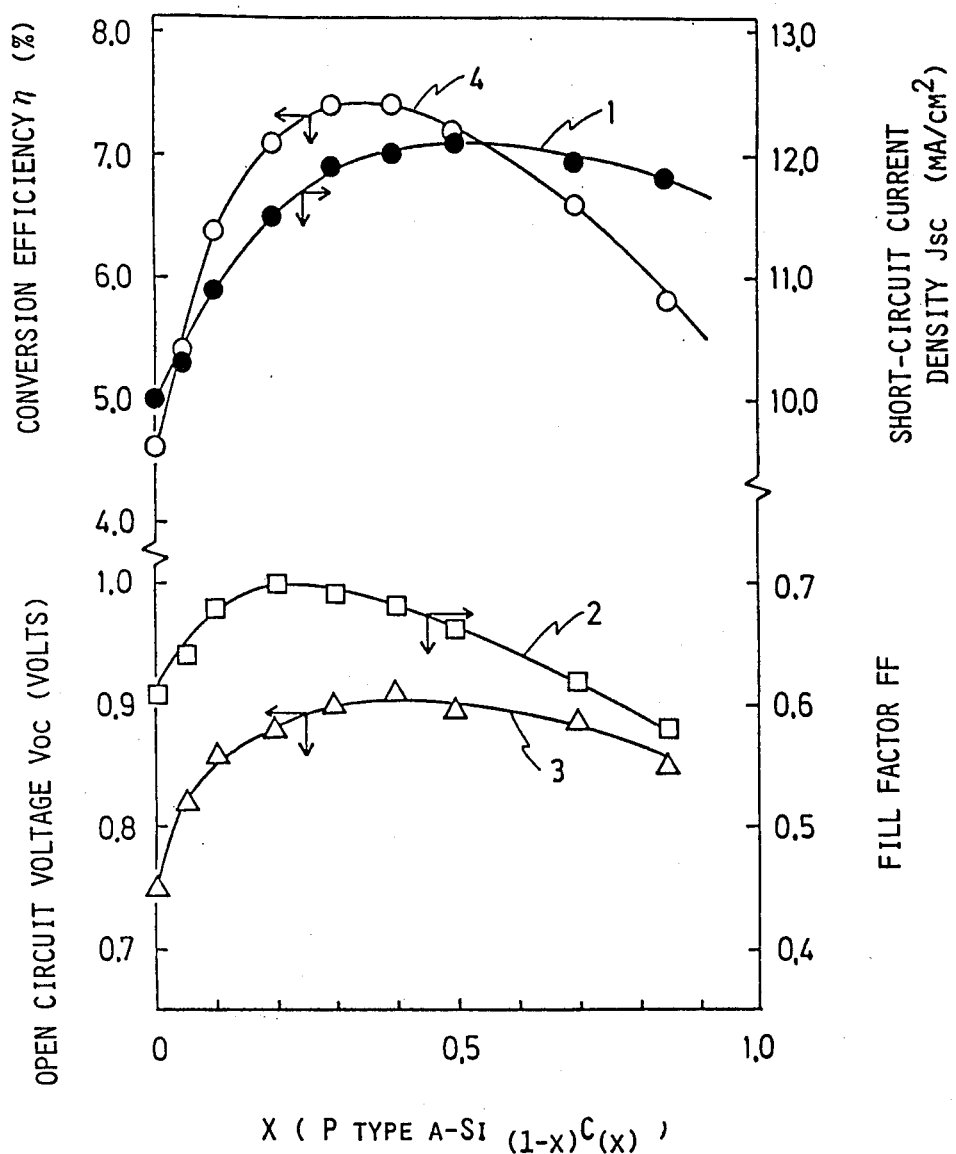

PHOTOVOLTAIC CELL HAVING A HETERO JUNCTION OF AMORPHOUS SILICON CARBIDE AND AMORPHOUS SILICON

CROSS-REFERENCE TO RELATED APPLICATION

This is a divisional of application Ser. No. 253,141, filed Apr. 10, 1981.

BACKGROUND OF THE INVENTION

1. Field of the Invention

This invention relates to a photovoltaic cell having a hetero junction of amorphous silicon carbide and amorphous silicon.

2. Description of the Prior Art

Amorphous silicon is obtained by the plasma decomposition of silane ($SiH_4$). W. E. Spear et al. discovered in 1976 that the electric conductivity of amorphous silicon could be altered considerably if it was doped with $PH_3$ or $B_2H_6$. D. E. Carlson et al. made a trial solar cell employing amorphous silicon in 1976. These events have drawn much attention to amorphous silicon, and research has come to be actively conducted for improving the conversion efficiency of a thin-film solar cell utilizing amorphous silicon.

The past studies have resulted in the development of thin-film amorphous silicon photovoltaic cells of the Schottky barrier type, p-i-n type, MIS type and hetero junction type. The first three types have been expected to provide high efficiency solar cells. A Schottky barrier type photovoltaic cell made by D. E. Carlson et al. in 1977 showed a conversion efficiency of 5.5%. J. I. B. Wilson et al. made an MIS type photovoltaic cell having a conversion efficiency of 4.8% in 1978. A p-i-n type photovoltaic cell made by Yoshihiro Hamakawa in 1978 achieved a conversion efficiency of 4.5%.

Solar cells of the p-i-n junction type have been unsatisfactory in a number of respects. The p or n type amorphous silicon fails to provide effective carriers having a satisfactorily long life. The p layer has a heavy absorption loss of light, since it has a higher light absorption coefficient than the i layer.

An inverted p-i-n type photovoltaic cell has been proposed to improve the aforesaid drawbacks of the p-i-n type photovoltaic cell. It is a cell in which light is applied to the n type amorphous silicon. It is somewhat better than the p-i-n type cell, since the n layer has a relatively wide band gap. However, the n type amorphous silicon also causes a loss of light absorption to some extent.

It is known to produce amorphous silicon carbide by mixing a hydrocarbon, such as methane and ethane, into silane, and decomposing it by glow discharge. See, for example, D. A. Anderson and W. E. Spear: Phil. Mag., 35, 1 (1977). According to the experiments conducted by D. E. Carlson et al., a solar cell having an intrinsic layer composed of amorphous silicon carbide obtained from silane and methane, and represented by the general formula $a-Si_{1-x}C_x$ showed a very low efficiency of photovoltaic conversion. While a solar cell having an intrinsic layer formed from silane not containing any methane had a conversion efficiency of 2.27%, the conversion efficiency of a solar cell having an intrinsic layer formed from silane containing 10% of methane was 1.4%, and that of a solar cell having an intrinsic layer formed from silane containing 30% of methane was as low as 0.08%. See, for example, "Topics in Applied Physics," Vol. 36, Amorphous Semiconductors, page 311 (1979), M. H. Brodsky, Springer-Verlag, Berlin, Heidelberg. Thus, it has hitherto been considered undesirable to use methane or any other hydrocarbon as being a defect center in an a-Si semiconductor.

SUMMARY OF THE INVENTION

It is an object of this invention to provide a p-i-n junction type amorphous silicon photovoltaic cell having a high photovoltaic conversion efficiency.

The inventors of this invention have conducted extensive research to obtain a p-i-n junction type amorphous silicon photovoltaic cell having an improved photovoltaic conversion efficiency. As a result, they have found it possible to improve the photovoltaic conversion efficiency of such a cell drastically if at least one of its p and n layers comprises a thin doping film of amorphous silicon carbide obtained by plasma decomposition of a mixture of at least one gas selected from among silane and its derivatives, and silicon fluoride and its derivatives, and at least one gas selected from among hydrocarbons, alkylsilanes and the fluorides thereof. The photovoltaic cells of this invention are very useful for solar cells, photoswitches, and the like.

BRIEF DESCRIPTION OF THE DRAWINGS

FIG. 1(a) is a schematic view showing a photovoltaic cell embodying this invention, and of the type to which light is applied to the p layer, while

FIG. 2 is a graph showing, in relation to different values of x, various characteristics of solar cells formed by p-i-n hetero-junction photovoltaic cells having a p layer of amorphous silicon carbide ($a-Si_{1-x}C_x$) doped with boron in the quantity of 0.1 atom % of silicon and carbon;

DETAILED DESCRIPTION OF THE INVENTION

According to this invention, amorphous silicon may be obtained if a mixed gas composed of silane ($SiH_4$), silicon fluoride, or any derivative thereof, or any mixture thereof, and hydrogen, or argon, helium or any other inert gas diluted with hydrogen is decomposed by radio frequency or DC glow discharge in accordance with the capacitive or inductive coupling method. The mixed gas may contain 0.5 to 50%, preferably 1 to 20%, of silane.

The substrate preferably has a temperature of 200° C. to 300° C., and comprises glass on which a transparent electrode composed, for example, of ITO or $SnO_2$ is deposited by vaporization, a polymer film, a metal or any other material used for forming a solar cell.

Figure 1A:
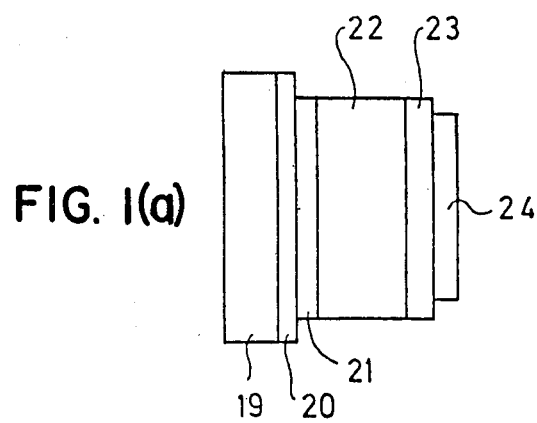
Figure 1B:
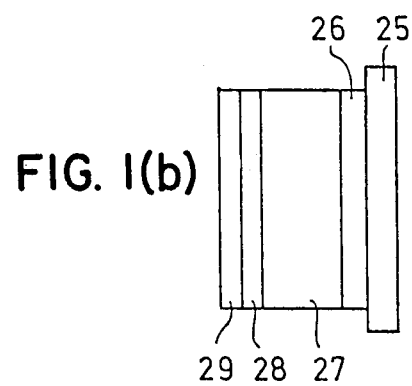
FIG. 1(b) shows a photovoltaic cell of the type to which light is applied to the n layer.

Referring to FIGS. 1(a) and 1(b) of the drawings, there are shown by way of example basic solar cell constructions embodying this invention. The solar cell shown in FIG. 1(a) is of the type to which light is applied to the p layer, and may, for example, comprise a glass substrate 19, a transparent electrode 20, a p type semiconductor 21 represented by the formula a-$Si_{1-x}C_x$, an i type semiconductor 22 represented by the formula a-Si, an n type semiconductor 23 represented by the formula a-Si, or a-$Si_{1-x}C_x$, and an aluminum electrode 24. The solar cell shown in FIG. 1(b) is of the type to which light is applied to the n layer, that is, the inverted p-i-n cell, and may, for example, comprise a stainless steel substrate 25, a p type semiconductor (a-Si or a-$Si_{1-x}C_x$) 26, an i type semiconductor (a-Si) 27, an n type semiconductor (a-$Si_{1-x}C_x$) 28, and a transparent electrode 29. The solar cell of this invention may, however, be of any other construction if it essentially comprises a p-i-n junction. For example, it is possible to provide a thin layer of insulating material or metal between the p layer and the transparent electrode.

The p-i-n junction is formed by the i layer interposed between the p and n type doped semiconductors, the i layer being composed of intrinsic amorphous silicon (i type a-Si) obtained by the glow discharge decomposition of silane, silicon fluoride, a derivative thereof, or a mixture thereof, and having a carrier life time of at least about $10^{-7}$ second, a localized density of states of about $10^{17}$ cm$^{-3}$ev$^{-1}$ or below and a mobility of at least $10^{-3}$ cm$^2$/V.

According to a salient feature of this invention, amorphous silicon carbide is incorporated into at least the of the p and n layers, i.e., the layer in which light is applied to the solar cell. The layer into which no amorphous silicon carbide is incorporated, if any, may be doped with an element of Group III of the Periodic Table if the p layer is composed of a-Si, or an element of Group V of the Periodic Table if the n layer is composed of a-Si.

According to this invention, amorphous silicon carbide may be obtained by the plasma decomposition, or more preferably glow discharge decomposition, of a mixture of at least one gas selected from among silane, silicon fluoride and the derivatives thereof, and at least one gas selected from among hydrocarbons, alkylsilanes, the fluorides thereof and the derivatives thereof. For this purpose, it is possible to use a silicon compound with hydrogen and/or fluorine, including silane $SiH_4$, silane derivatives represented by the formula $Si_nH_{2n+2}$, derivatives of the formula $SiF_mH_{4-m}$ (m=1 to 4), and derivatives of the formula $Si_nF_mH_{2n+2-m}$. Examples of the applicable carbon compounds include carbon tetrafluoride $CF_4$, fluorohydrocarbon derivatives of the formula $C_nF_mH_{2n+2-m}$, and the unsaturated derivatives thereof. Examples of the suitable hydrocarbons include saturated aliphatic hydrocarbons ($C_nH_{2n+2}$), and unsaturated aliphatic hydrocarbons ($C_nH_{2n}$), such as ethylene and propylene. In other words, any hydrogen and/or fluorine derivative of silicon having vapor pressure may be used as a source of silicon for producing amorphous silicon carbide, and any hydrogen and/or fluorine derivative of carbon having vapor pressure may be used as a source of carbon. The composition of silicon carbide is represented by the formula a-$Si_{1-x}C_x$ showing the ratio of the number of silicon and carbon atoms in the film formed by glow discharge decomposition. For example, the formula can be rewritten as a-$Si_{0.5}C_{0.5}$ if the numbers of carbon and silicon atoms in the film have a ratio of 1:1. The ratio of carbon and silicon atoms in the film can be obtained by IMA, SIMS, Auger, ESCA, or other methods of electron spectroscopy. According to this invention, the atomic fraction x in the formula a-$Si_{1-x}C_x$ is preferably in the range of about 0.05 to about 0.95.

Amorphous silicon carbide is doped for use in forming an n or p type semiconductor. It may be doped with an element of Group V of the Periodic Table, such as phosphorus, to form an n type semiconductor. The doping of amorphous silicon carbide may be accomplished during its production if phosphine ($PH_3$) is mixed with silane and methane, and the mixture is decomposed by glow discharge. The doping density may be controlled so as to provide an electrical conductivity of at least about $10^{-7}(\Omega cm)^{-1}$, preferably at least $10^{-6}(\Omega cm)^{-1}$, at room temperature. Amorphous silicon carbide is doped with phosphorus so that it may usually contain about 0.001 to 10 atom %, and preferably 0.005 to 2.0 atom %, of phosphorus.

Amorphous silicon carbide may be doped with an element of Group III of the Periodic Table, such as boron, to form a p type semiconductor. The doping thereof with boron may, for example, be accomplished if diborane ($B_2H_6$) is mixed with silane and methane, and the mixture is decomposed by glow discharge. The doping density may be controlled so as to provide an electrical conductivity of at least about $10^{-8}(\Omega cm)^{-1}$, preferably at least $10^{-7}(\Omega cm)^{-1}$ at room temperature. Amorphous silicon carbide is doped with boron so that it may usually contain about 0.001 to 10 atom %, and preferably 0.005 to 2.0 atom %, of boron.

Hydrogen or fluorine plays an important role in amorphous silicon carbide. They are considered to act as terminators for dangling bonds as in amorphous silicon obtained by the glow discharge decomposition of silane or silane fluoride. The concentration of hydrogen and/or fluorine in a film of amorphous silicon carbide depends largely on the substrate temperature, and other conditions for manufacture. According to this invention, the film contains about 3 to 20 atom % of hydrogen and/or fluorine, since the substrate temperature is preferably in the range of 200° C. to 350° C.

According to the typical construction of the hetero junction photovoltaic cell of this invention, a p or n layer of amorphous silicon carbide (a-$Si_{1-x}C_x$) is provided immediately behind a transparent electrode, and followed by an i layer of amorphous silicon (a-Si), an n or p layer of amorphous silicon (a-Si) and an electrode. Light is applied through the transparent electrode. The transparent electrode is preferably formed from ITO or $SnO_2$, and more preferably from $SnO_2$. It may be deposited by vaporization on a glass substrate, or directly on the p or n type amorphous silicon carbide.

The p or n type amorphous silicon carbide top layer to which illumination is applied may have a thickness of about 30 to 300 Å, and preferably 50 to 200 Å. The thickness of the i type amorphous silicon layer has no limitation in particular, but may usually be in the range of about 2,500 to 10,000 Å. The thickness of the n or p type amorphous silicon bottom layer, which is provided for making junction and ohmic contact, has no limitation in particular, but may usually be in the range of about 150 to 600 Å. It is possible to provide another layer of amorphous silicon carbide in place of the n or p type amorphous silicon layer.

The invention will now be described in further detail with reference to examples. The glow discharge decomposition of the various materials was carried out in a quartz reaction tube having an inside diameter of 11 cm at a radio frequency of 14.56 MHz. The i type amorphous silicon was obtained by the glow discharge decomposition of silane diluted with hydrogen at a pressure of 2 to 10 Torr. Likewise, the n type amorphous silicon was prepared by the glow discharge decomposition of a dilution in hydrogen of silane ($SiH_4$) and phosphine ($PH_3$), containing 0.5 mol % of $PH_3$ based on $SiH_4$. Moreover, p type amorphous silicon carbide was prepared by the glow discharge decomposition of a dilution in hydrogen of silane, methane ($CH_4$) and diborane ($B_2H_6$) containing 0.10 atom % of boron based on the total quantity of Si and C. Various compositions of amorphous silicon carbide were prepared by altering the composition of the gaseous mixture to be decomposed by glow discharge, so that the atomic fraction x in the formula a-$Si_{1-x}C_x$ might vary in the range of 0.05 to 0.85.

A number of solar cells were prepared, and contained different kinds of amorphous silicon carbide as hereinabove described. Each solar cell comprised a glass substrate on which a thin film of $SnO_2$ (25 Ω/□) had been deposited by vaporization, a layer of p type amorphous silicon carbide on the $SnO_2$ film, a layer of i type amorphous silicon, a layer of n type amorphous silicon, and a layer of aluminum deposited by vaporization on the n layer and having a relation sensitive area of 3.3 mm$^2$. The characteristics of of each solar cell thus prepared were determined by a solar simulator AM-1 (100 mW/cm$^2$). The glow discharge decomposition was caused to take place at a substrate temperature of 250° C. The i layer had a thickness of 5,000 Å, the n layer had a thickness of 500 Å, and the p layer had a thickness of 135 Å.

The various characteristics of these solar cells are shown in FIG. 2 in relation to the different compositions of p type amorphous silicon carbide. In FIG. 2, curve 1 shows the short-circuit current density Jsc (mA/cm$^2$), curve 2 shows the fill factor FF, curve 3 shows the open circuit voltage Voc (volts), and curve 4 shows the conversion efficiency η (%). It will be noted from curve 4 that while a solar cell having a p layer composed of 100% silane ($Si_1C_0$) (i.e., x=0) had a conversion efficiency η of 4.6%, the solar cells according to this invention showed a greatly improved conversion efficiency, for example, of 5.4% when x=0.05, 7.1% when x=0.2, and 7.2% when x=0.4.

The solar cells of this invention showed a reduction in conversion efficiency when x was 0.5 or above. This was due to the lower fill factor FF caused by an increase in the series resistance of p type amorphous silicon carbide. There was substantially no reduction in the short-circuit circuit current Jsc. Thus, it is obvious that the improved conversion efficiency of the solar cells according to this invention is due to a reduction in the loss of light absorption in the p type aamorphous silicon carbide layer, and hence, an increase in the short-circuit current Jsc and the open circuit voltage Voc.

The same results were obtained for solar cells containing amorphous silicon carbide prepared from $SiF_4$ and $CH_4$.

Figure 3:
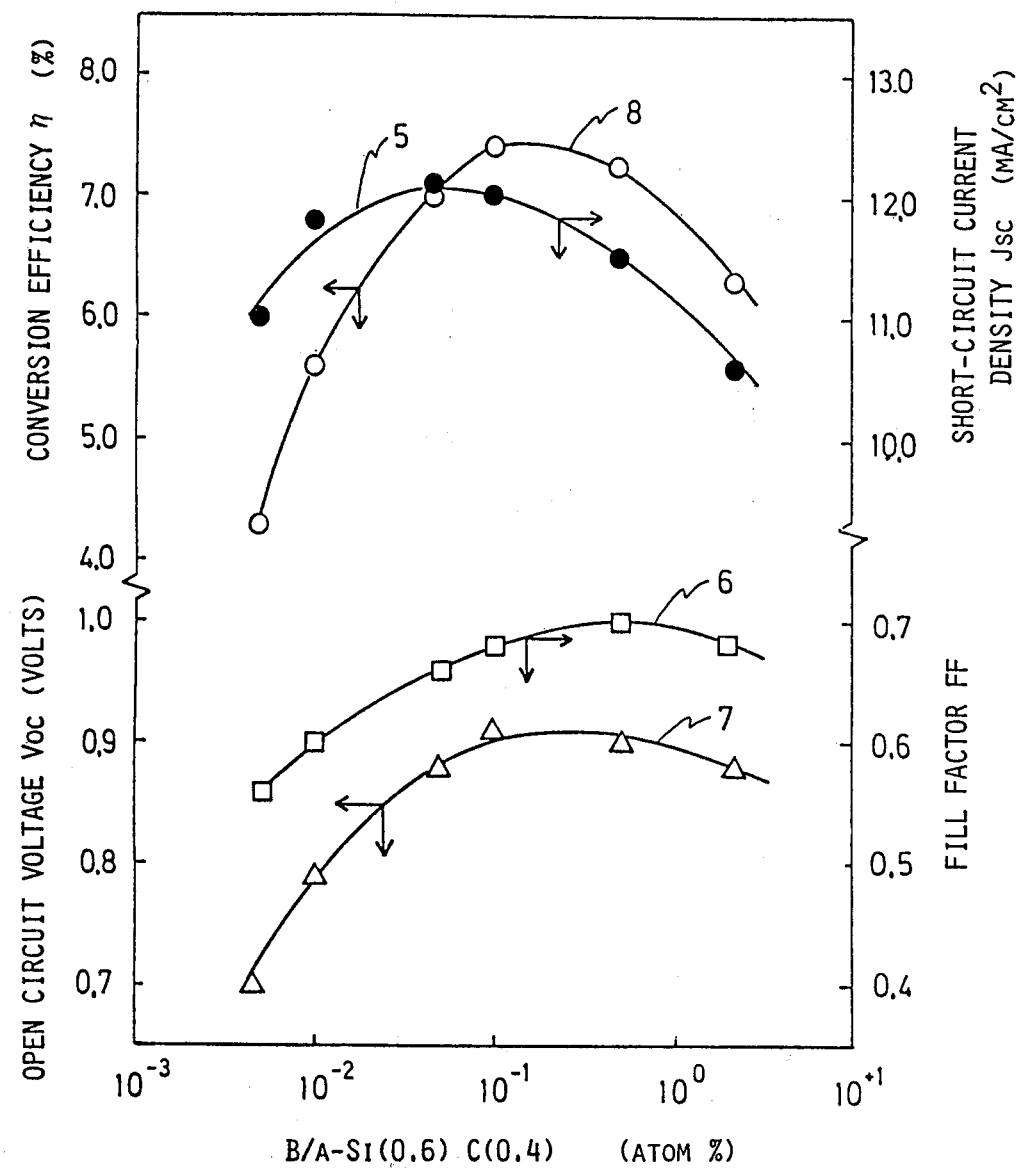
FIG. 3 is a graph showing various characteristics of solar cells formed by p-i-n hetero-junction photovoltaic cells having a p layer of amorphous silicon carbide represented as $a-Si_{0.6}C_{0.4}$ and doped with boron in different quantities from 0.005 to 2.0 atom % based on the total quantity of silicon and carbon.

A number of solar cells were prepared by employing amorphous silicon carbide of the formula a-$Si_{0.6}C_{0.4}$ doped with different quantities of boron (B) in the range of 0.005 to 2.0 atom % based on the total quantity of Si and C. The various characteristics of these solar cells are shown in FIG. 3, in which curve 5 shows the short-circuit current Jsc, curve 6 shows the fill factor FF, curve 7 shows the open circuit voltage Voc, and curve 8 shows the conversion efficiency η. As is obvious from FIG. 3, when the quantity of boron is small, the fill factor and open circuit voltage of the solar cells according to this invention are low, but they show a by far higher conversion efficiency than any solar cell comprising p type amorphous silicon. If the quantity of boron is 0.5% or greater, the short-circuit current becomes lower, because a higher concentration of boron in the p type amorphous silicon carbide layer brings about an increase of optical absorption coefficient.

Figure 4:
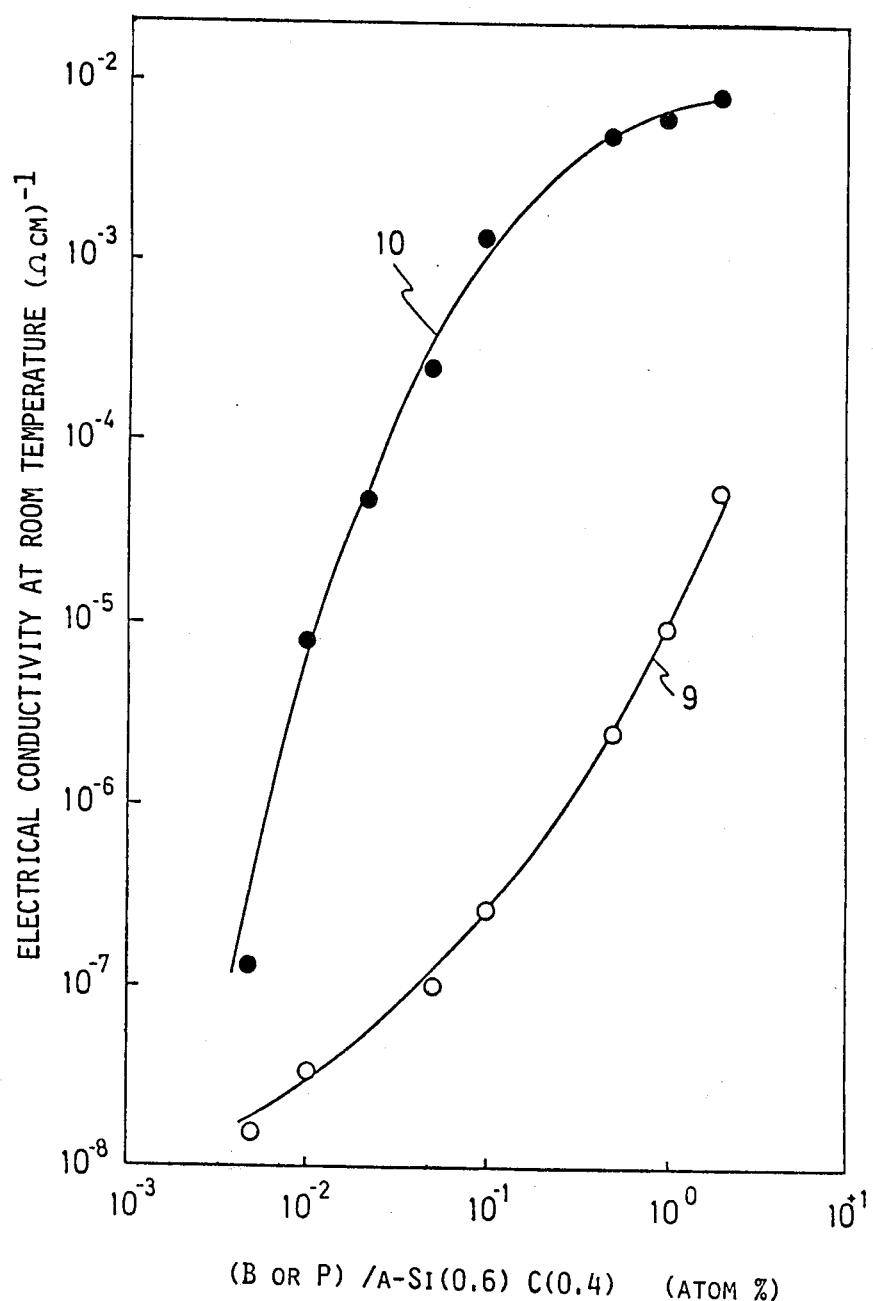
FIG. 4 is a graph showing changes in the electrical conductivity at room temperature of amorphous silicon carbide ($a-Si_{0.6}C_{0.4}$) films doped with different quantities of boron or phosphorus.

FIG. 4 shows the dependence, on the quantity of boron, of the electrical conductivity of p type amorphous silicon carbide at room temperature. Curve 9 is relevant here, while curve 10 refers to the case in which phosphorus is used as a doping material as will hereinafter be mentioned. As is obvious from comparison of the characteristics of the solar cells shown in FIG. 3 and the electrical conductivity of the p type amorphous silicon carbide shown in FIG. 4, it is preferable to select the quantity of boron so as to ensure that the p type amorphous silicon carbide has an electrical conductivity of at least $10^{-8}$ (Ωcm)$^{-1}$.

Figure 5:
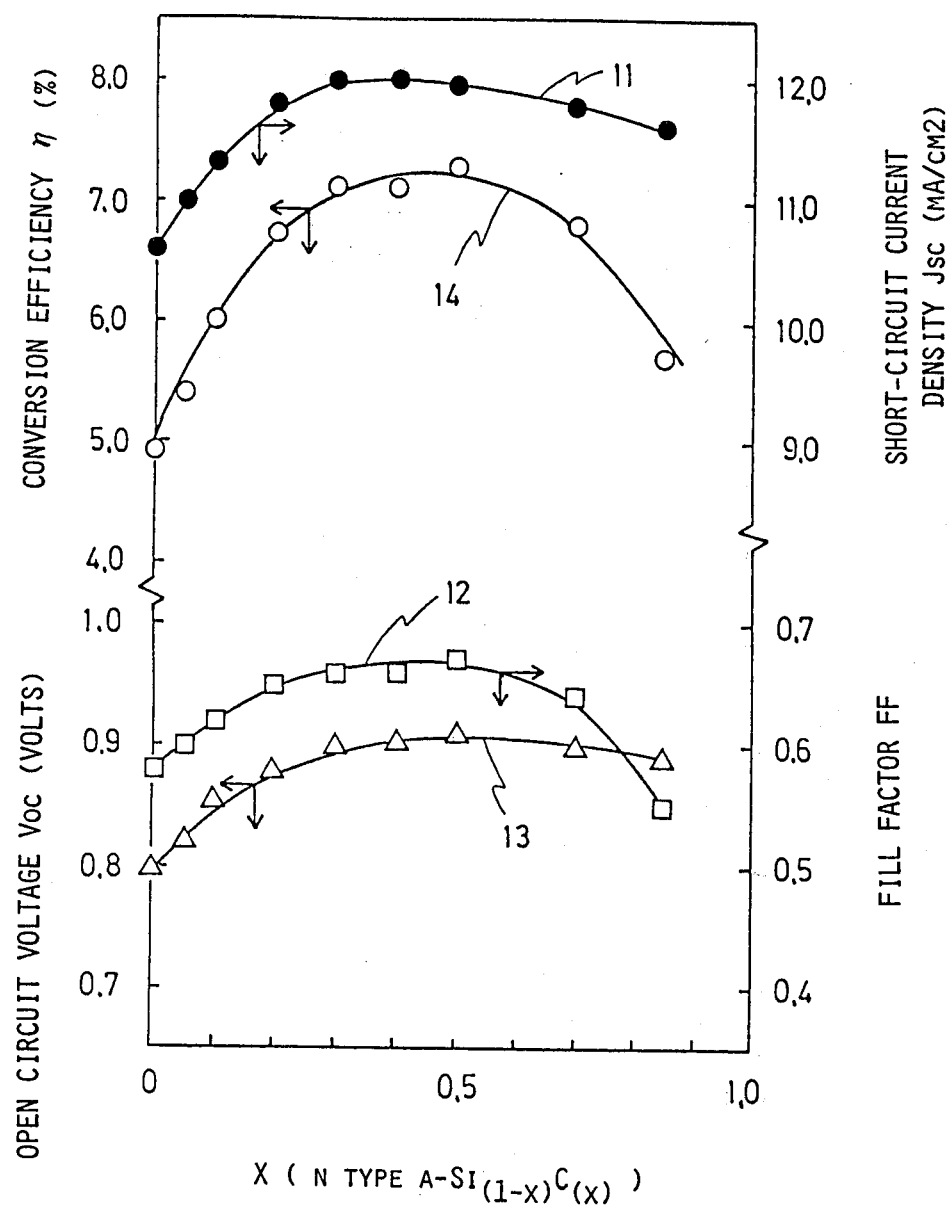
FIG. 5 is a graph showing, in relation to different values of x, various characteristics of solar cells formed by p-i-n hetero-junction photovoltaic cells having an n layer of amorphous silicon carbide ($a-Si_{1-x}C_x$) doped with phosphorus in the quantity of 0.5 atom % of silicon and carbon.

Attention is now directed to examples of the solar cells comprising n type amorphous silicon carbide. A number of solar cells were prepared by glow discharge decomposition. Each solar cell comprised a stainless steel substrate, a layer of p type amorphous silicon doped with 1 mol % of $B_2H_6$ and having a thickness of 200 Å, a layer of i type amorphous silicon having a thickness of 5,000 Å, and a layer of n type amorphous silicon carbide doped with $PH_3$ and having a thickness of 100 Å. The amorphous silicon was prepared from silane, and the amorphous silicon carbide from silane and methane, by glow discharge decomposition. A film of ITO was deposited by electron beam vaporization on the n type amorphous silicon carbide. The n type amorphous silicon carbides in these solar cells were doped with 0.5 atom % of phosphorus based on the total quantity of Si and C, but had different compositions as defined by different values of atomic fraction x in the range of 0.05 to 0.85. The characteristics of these solar cells are shown in FIG. 5, in which curve 11 shows the short-circuit current density Jsc, curve 12 shows the fill factor FF, curve 13 shows the open circuit voltage Voc, and curve 14 shows the conversion efficiency η. As is obvious from FIG. 5, the short-circuit current density, as well as the fill factor and the open circuit voltage, showed a substantially constant increase until the value of x reached 0.5. The conversion efficiency was as high as 7.3% when x was 0.5, though it thereafter showed a tendency to decrease with a reduction in the fill factor when x was greater than 0.5. In any event, the solar cells according to this invention showed a greatly improved conversion efficiency when the value of x was in the range of 0.05 to 0.95, as compared with a solar cell comprising n type amorphous silicon of which the conversion efficiency was 4.9% as shown at x=0 in FIG. 5.

Figure 6:
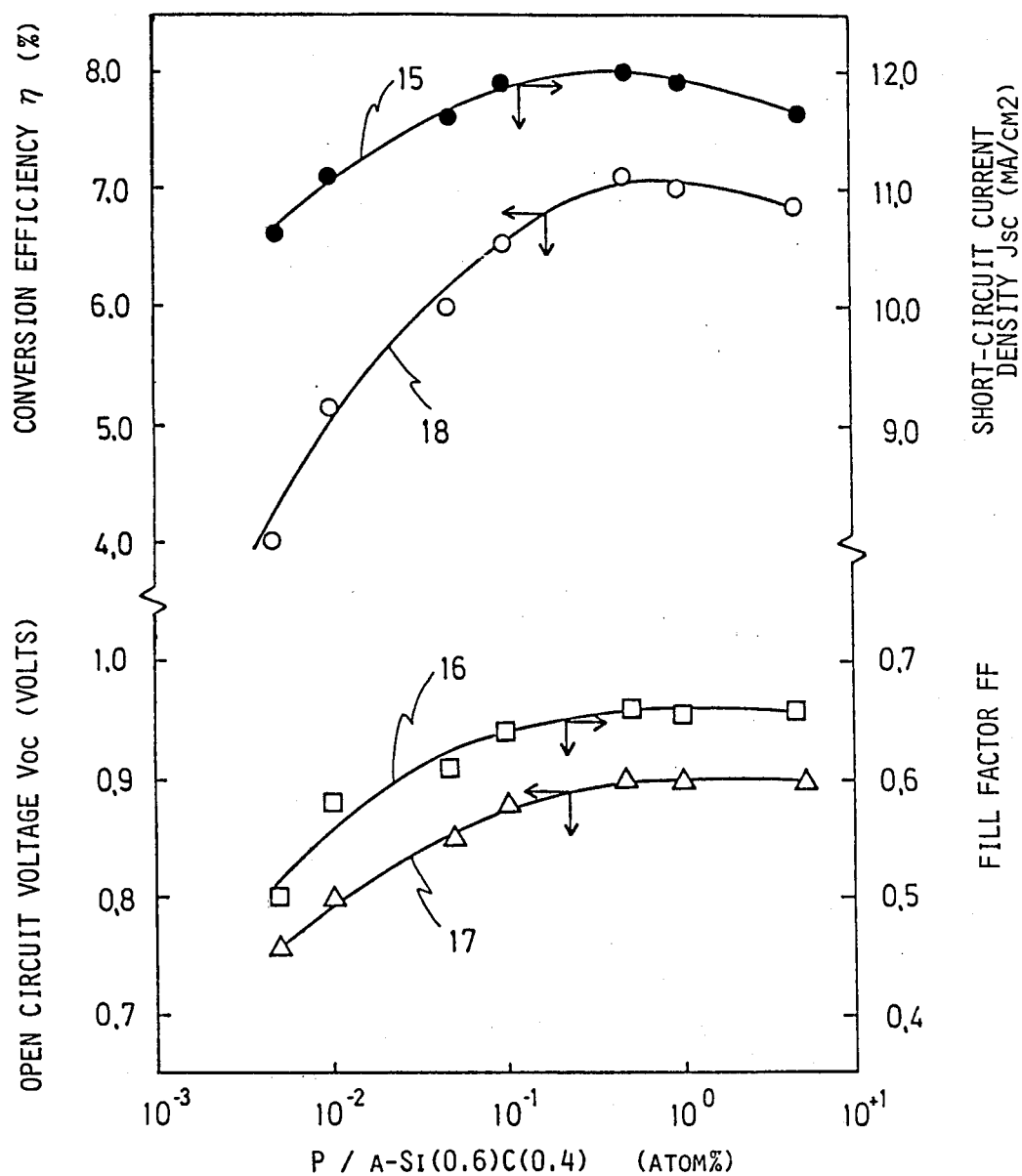
FIG. 6 is a graph showing various characteristics of solar cells formed by p-i-n hetero-junction photovoltaic cells having an n layer of amorphous silicon carbide represented as $a-Si_{0.6}C_{0.4}$ and doped with phosphorus in different quantities from 0.005 to 2.0 atom % based on the total quantity of silicon and carbon.

FIG. 6 shows the various characteristics of solar cells comprising n type amorphous silicon carbide of the formula a-$Si_{0.6}C_{0.4}$ doped with different quantities of phosphorus in the range of 0.005 to 2.0 atom % based on the total quantity of Si and C. In FIG. 6, curves 15 to 18 show the short-circuit current density Jsc, the fill factor FF, the open circuit voltage Voc and the conversion efficiency $\eta$, respectively. It will be noted thaat the short-circuit current density, the fill factor and the open circuit voltage increased with an increase in the quantity of phosphorus. In view of these results, and curve 10 in FIG. 4 showing the dependence of the electrical conductivity of n type amorphous silicon carbide (a-$Si_{0.6}C_{0.4}$) at room temperature on the quantity of phosphorus, it is obvious that it is preferable to select the quantity of phosphorus so as to ensure that the n type amorphous silicon carbide has an electrical conductivity of at least $10^{-7}(\Omega cm)^{-1}$.

While the invention has been described with reference to examples thereof, it is to be understood that modifications or variations may be easily made by anybody of ordinary skill in the art without departing from the spirit and scope of this invention as defined by the appended claims.

What is claimed is:

1. A p-i-n junction photovoltaic cell comprising a p-type doped amorphous semi-conductor layer having an electrical conductivity of at least $10^{-8}(\Omega cm)^{-1}$ at room temperature and having a thickness of about 30 Å to about 300 Å and made of a substance represented by the general formula a-$Si_{1-x}C_x$, a layer of intrinsic amorphous silicon and an n-type doped amorphous semiconductor layer made of a substance represented by the general formula a-$Si_{1-x}C_x$, and wherein said p-type doped layer is in ohmic contact with a transparent film electrode on the incident side of the photovoltaic cell.

2. A photovoltaic cell as set forth in claim 1, wherein said p type doped layer has a thickness of 50 Å to 200 Å.

3. A p-i-n junction photovoltaic cell comprising an n type doped amorphons semiconductor layer having an electrical conductivity of at least about $10^{-7}(\Omega cm)^{-1}$ at room temperature and having a thickness of about 30 Å to about 300 Å and made of a substance represented by the general formula a-$Si_{1-x}C_x$; a layer of intrinsic amorphous silicon and a p type doped amorphous semiconductor layer made of a substance represented by the general formula a-$Si_{1-x}C_x$; and wherein said n type doped layer is in ohmic contact with a transparent film electrode on the incident side of the photovoltaic cell.

4. A photovoltaic cell as set forth in claim 3, wherein said n type doped layer has a thickness of 50 Å to 200 Å.

5. A photovoltaic cell as set forth in claim 1 or 3, wherein the atomic fraction X in said general formula is in the range of about 0.05 to about 0.95.

6. A photovoltaic cell as set forth in claim 5, wherein the atomic fraction X in said general formula is below 0.5.

* * * * *